United States Patent
Nakajima et al.

(10) Patent No.: US 10,828,725 B2
(45) Date of Patent: Nov. 10, 2020

(54) METHOD OF NITRIDING AND INSPECTING LASER-IRRADIATED NICKEL FILM

(71) Applicant: DENSO CORPORATION, Aichi-pref (JP)

(72) Inventors: Sachiko Nakajima, Toyota (JP); Atsushi Fukunishi, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/382,553

(22) Filed: Apr. 12, 2019

(65) Prior Publication Data

US 2019/0321918 A1 Oct. 24, 2019

(30) Foreign Application Priority Data

Apr. 24, 2018 (JP) ................. 2018-083037

(51) Int. Cl.
| | | |
|---|---|---|
| *B23K 26/352* | (2014.01) | |
| *H01L 23/29* | (2006.01) | |
| *H01L 23/31* | (2006.01) | |
| *B23K 26/08* | (2014.01) | |
| *H01L 21/02* | (2006.01) | |
| *H01L 21/67* | (2006.01) | |
| *B23K 26/00* | (2014.01) | |
| *H01L 21/268* | (2006.01) | |

(52) U.S. Cl.
CPC ........ *B23K 26/352* (2015.10); *B23K 26/0006* (2013.01); *B23K 26/08* (2013.01); *H01L 21/02365* (2013.01); *H01L 21/268* (2013.01); *H01L 21/67115* (2013.01); *H01L 23/29* (2013.01); *H01L 23/31* (2013.01)

(58) Field of Classification Search
CPC ........ H01L 21/02365; H01L 21/67115; H01L 21/268; H01L 21/76856; B23K 26/352
See application file for complete search history.

(56) References Cited

U.S. PATENT DOCUMENTS

| | | | | |
|---|---|---|---|---|
| 2009/0202807 A1* | 8/2009 | Takeyama | ............. | C23C 14/185 428/220 |
| 2014/0354755 A1* | 12/2014 | Ashtiani | ................. | B44C 1/228 347/232 |
| 2015/0076518 A1 | 3/2015 | Tanigawa et al. | | |

FOREIGN PATENT DOCUMENTS

| | | |
|---|---|---|
| JP | 2013-197429 A | 9/2013 |
| JP | 2017-191807 A | 10/2017 |

\* cited by examiner

*Primary Examiner* — Ermias T Woldegeorgis
(74) *Attorney, Agent, or Firm* — Sughrue Mion, PLLC

(57) ABSTRACT

A method of inspection of a laser-irradiated nickel film is disclosed. The method may include: reducing a surface of the laser-irradiated nickel film under a reducing gas atmosphere; heating the surface of the nickel film at 250 degrees Celsius or higher under a nitrogen atmosphere after the reducing; measuring a color of the surface of the nickel film after the heating; and assessing a condition of the surface of the nickel film based on a result of the color measuring.

10 Claims, 6 Drawing Sheets

METHOD OF NITRIDING AND INSPECTING LASER-IRRADIATED NICKEL FILM

CROSS-REFERENCE

This application claims priority to Japanese Patent Application No. 2018-083037, filed on Apr. 24, 2018, contents of which are incorporated herein by reference.

TECHNICAL FIELD

The technology disclosed herein relates to a method of inspection of a laser-irradiated nickel film.

BACKGROUND

Japanese Patent Application Publication No. 2017-191807 describes a method of manufacturing a semiconductor device. This method of manufacturing a semiconductor device includes a step of irradiating a nickel film provided on a conductor member with laser. In this laser-irradiating step, fine concave-convex patterns are formed on the nickel film of the conductor member. The fine concave-convex patterns of the nickel film improve adhesion between the conductor member and a sealing member that is to make contact with the conductor member, by an anchoring effect.

SUMMARY

When a nickel film is irradiated with laser, processing parameters need to be set suitably. When the processing parameters such as laser power and irradiation time are not suitable, fine concave-convex patterns cannot be formed appropriately on the nickel film. In order to set the suitable processing parameters, suitability of used processing parameters needs to be assessed by inspecting the laser-irradiated nickel film. However, it is difficult to objectively assess the suitability by a mere direct observation on the fine concave-convex patterns formed on the nickel film. As such, a method may be considered in which dimensions of laser marks formed on the nickel film are measured and a processed condition of the nickel film is estimated based thereon. However, this method requires each of the large number of laser marks formed on the nickel film to be measured independently, and thus a long period of time is required. Another method is considered in which water wettability of the nickel film is inspected and the processed condition of the nickel film is estimated based thereon. However, since the nickel film needs to be wetted with water, the post-inspection conductor member can no longer be used in a product. In view of the above problem, the disclosure herein provides a novel and useful technology for inspecting a laser-irradiated nickel film.

A method of inspection of a laser-irradiated nickel film is disclosed herein. The method may comprise: reducing a surface of the laser-irradiated nickel film under a reducing gas atmosphere; heating the surface of the nickel film at 250 degrees Celsius or higher under a nitrogen atmosphere after the reducing; measuring a color of the surface of the nickel film after the heating; and assessing a condition of the surface of the nickel film based on a result of the color measuring.

DETAILED DESCRIPTION

Figure 1:
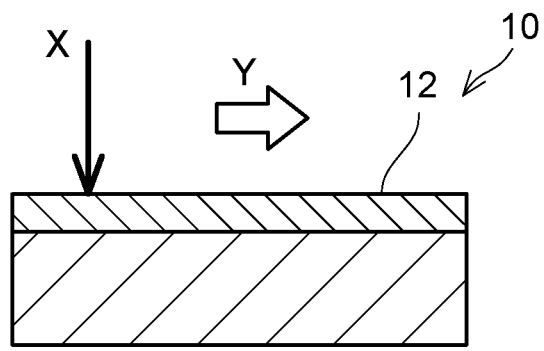
FIG. 1 is a schematic diagram showing a laser irradiation step.

In an embodiment of the present technology, a method of inspection of a laser-irradiated nickel film may comprise: reducing a surface of the laser-irradiated nickel film under a reducing gas atmosphere; heating the surface of the nickel film at 250 degrees Celsius or higher under a nitrogen atmosphere after the reducing; measuring a color of the surface of the nickel film after the heating; and assessing a condition of the surface of the nickel film based on a result of the color measuring.

In the aforementioned method of inspection, the reduced surface of the nickel film is heated at 250 degrees Celsius or higher under the nitrogen atmosphere. In doing so, nitriding reaction occurs on the surface of the nickel film if fine concave-convex patterns are formed on the surface of the nickel film, and nickel nitride is thereby formed on the nickel film. When the nickel nitride is formed on the nickel film, the color of the surface of the nickel film changes. Contrary to this, if the fine concave-convex patterns are not formed on the surface of the nickel film, the nitriding reaction does not progress sufficiently and the color of the nickel film is thereby less likely to change. As such, the condition of the surface of the laser-irradiated nickel film can be assessed by measuring the color of the surface of the nickel film after the heating. Due to this, the inspection of the nickel film can be carried out without dimension measurement of laser marks and water wettability test.

In an embodiment of the technology disclosed herein, the result of the color measuring may comprise at least an index indicating a red component. In this case, the assessing of the condition may comprise assessing the condition of the surface of the nickel film, such as a processed condition of the nickel film created by the laser irradiation, based on the index indicating the red component. In this case, although this is merely an example, the processed condition of the nickel film created by the laser irradiation may be assessed as defective when a result of red color measuring is less than a predetermined reference value. It has been confirmed by the inventors of the present technology that with presence of the fine concave-convex patterns on the surface of the nickel film, a value of the index indicating the red component increases in the color measurement on the surface of the nickel film. As such, the laser-irradiated nickel film can objectively be evaluated by assessing the surface condition of the nickel film based on the index indicating the red component.

As an alternative to or in addition to the above, the result of the color measuring may comprise at least an index indicating a blue component. In this case, the assessing of the condition may comprise assessing the condition of the surface of the nickel film, such as the processed condition of the nickel film created by the laser irradiation, based on the index indicating the blue component. In this case, although this is merely an example, the processed condition of the nickel film created by the laser irradiation may be assessed as defective when a result of blue color measuring is greater than a predetermined reference value. It has been confirmed by the inventors of the present technology that with the presence of the fine concave-convex patterns on the surface of the nickel film, a value of the index indicating the blue component decreases in the color measurement on the surface of the nickel film. As such, the laser-irradiated nickel film can objectively be evaluated also by assessing the surface condition of the nickel film based on the index indicating the blue component.

In an embodiment of the technology disclosed herein, the assessing of the condition may comprise assessing cleanliness of the nickel film based on the index indicating the blue component. In further detail, whether an organic compound adheres to the nickel film or not may be assessed based on the index indicating the blue component. In this case, although this is merely an example, it may be assessed that the organic compound adheres to the nickel film when the index indicating the blue component is greater than a predetermined reference value. When contamination of an organic compound adheres to the nickel film, the color of the nickel film changes to blue by chemical reaction of the adhered organic compound and nitride. Due to this, the cleanliness of the nickel film (to be more precise, presence of the organic compound thereon) can also be assessed based on the index indicating the blue component.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved methods of inspection of a laser-irradiation nickel film.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

A method of inspection according to an embodiment will be described with reference to the drawings. In this inspection method, a laser-irradiated nickel film 12 is inspected. The nickel film 12 to be irradiated with laser is provided on a conductor member 10, and may be formed by sputtering, for example. The conductor member 10 has a substantially plate-like shape or a rectangular shape, and may be constituted of a conductive material such as copper, aluminum, or other metal. Although this is merely an example, the conductor member 10 may be used as a component in a semiconductor device, and may be integrally packaged with a semiconductor element by a sealing body (such as resin).

Figure 2:
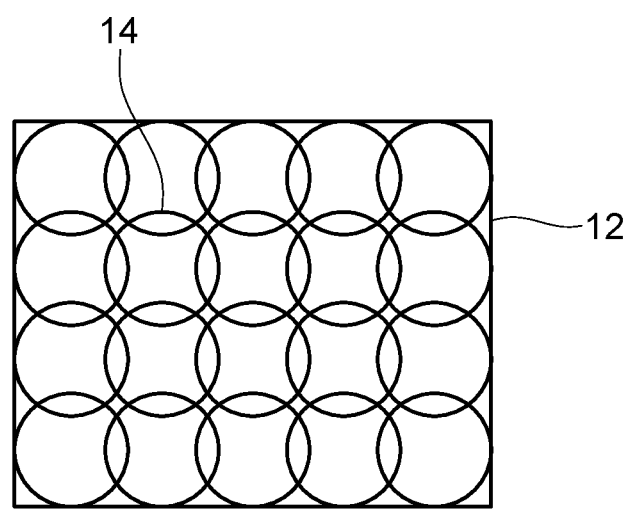
FIG. 2 is a top view of a laser-irradiated nickel film 12.

Here, prior to the description of the inspection method, a laser irradiation step of irradiating the nickel film 12 with laser will be described with reference to FIGS. 1 and 2. As shown in FIG. 1, in the laser irradiation step, a part of or an entirety of the nickel film 12 is irradiated with laser (in a direction along an arrow X in FIG. 1). Although this is merely an example, in the laser irradiation step, a pulse laser device may be used to intermittently irradiate the nickel film 12 with spot-type laser while scanning over the nickel film 12. An arrow Y in FIG. 1 shows a laser scanning direction. Fine concave-convex patterns are formed on the nickel film 12 by such laser irradiation. The fine concave-convex patterns can, for example, improve adhesion between the conductor member 10 and the sealing body. As shown in FIG. 2, when the nickel film 12 after the laser irradiation step is observed, a large number of laser marks 14 is formed on the laser-irradiated nickel film 12. Although this is merely an example, circular laser marks 14 are formed in the laser irradiation step of the present embodiment, and a diameter size thereof is about 70 micrometers.

In this laser irradiation step, the fine concave-convex patterns are not formed appropriately on the nickel film 12 if processing parameters, such as power and irradiation time of the laser, are not suitable. In order to set the suitable processing parameters, suitability of the used processing parameters needs to be assessed by inspecting the laser-irradiated nickel film 12. In regards to this point, the inspection method according to the present embodiment enables a condition of the laser-irradiated nickel film 12 to be evaluated objectively. Hereinbelow, the inspection method according to the present embodiment will be described in detail.

Figure 3:
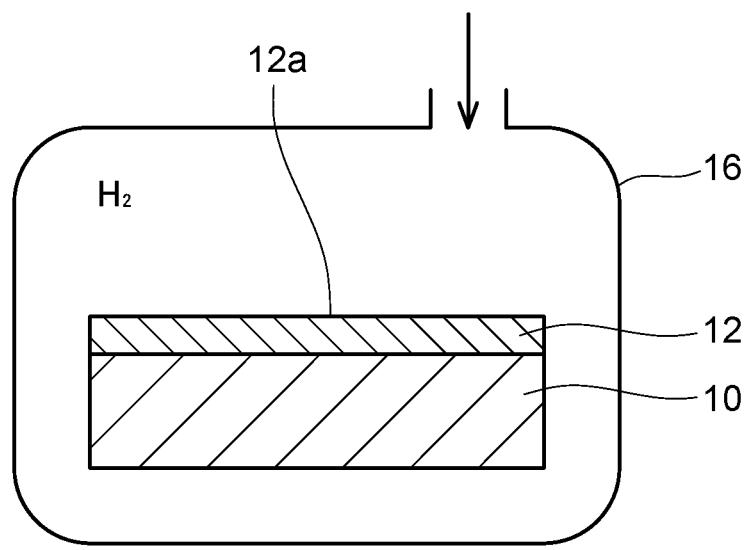
FIG. 3 is a schematic diagram showing a step of reducing a surface 12a of the nickel film 12 under a reducing gas atmosphere (reducing step S12).
Figure 7:
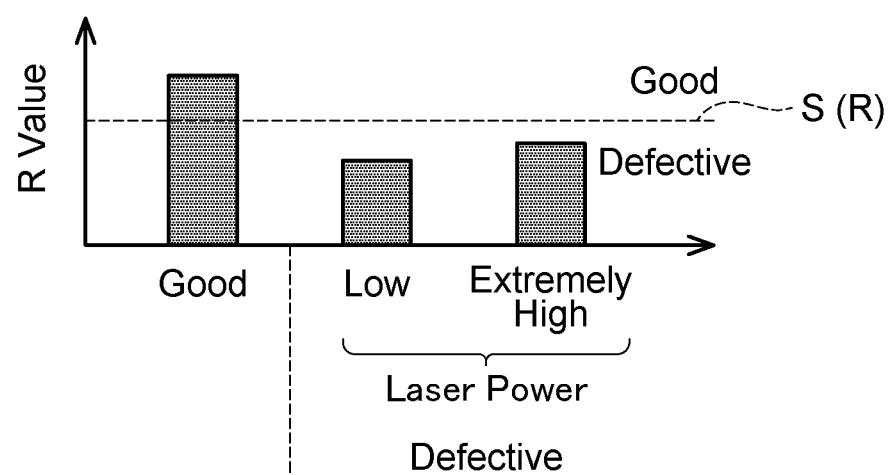
FIG. 7 is a graph explaining a step of assessing a surface condition of the nickel film 12 based on the R value.
Figure 8:
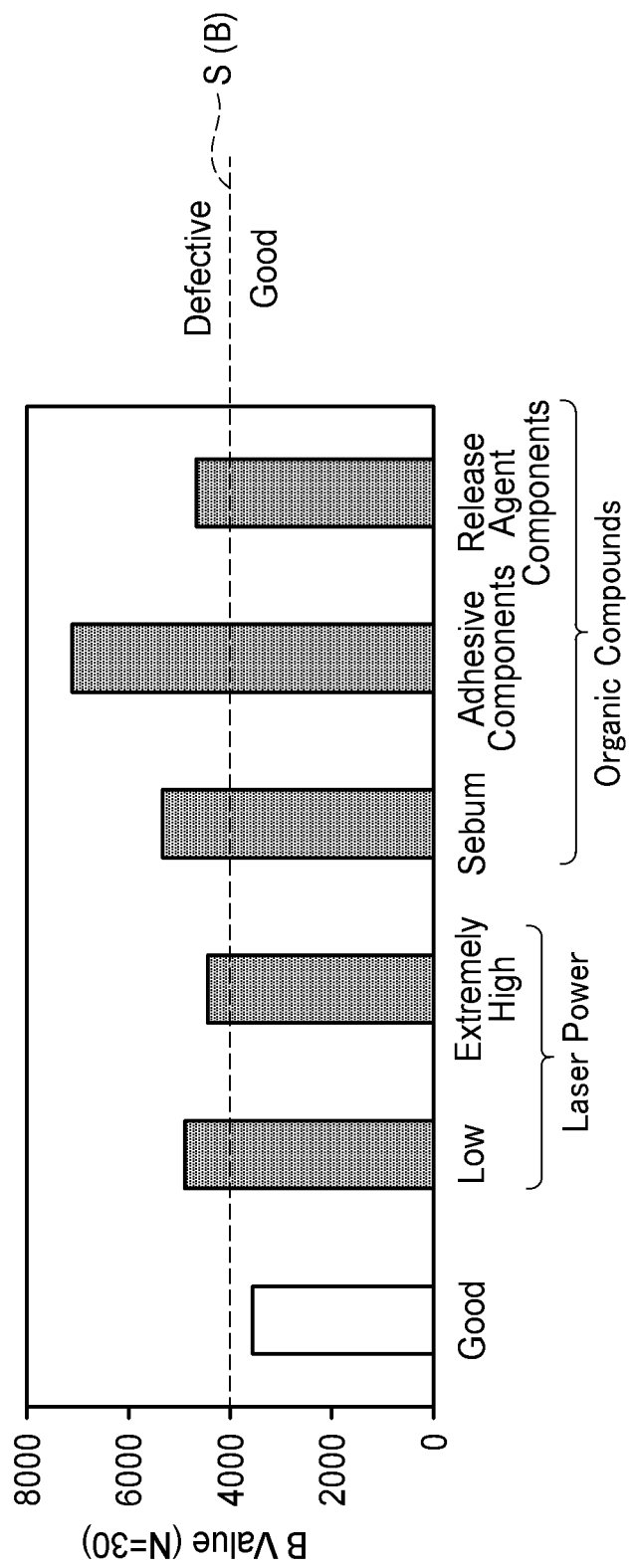
FIG. 8 is a graph explaining a step of assessing the surface condition of the nickel film 12 based on a B value.
Figure 9:
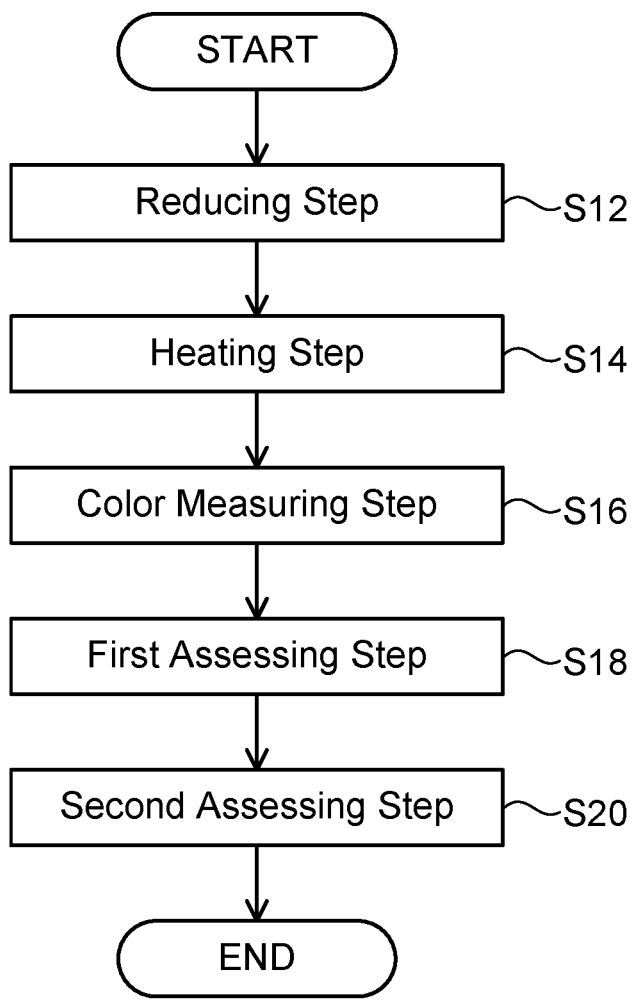
FIG. 9 is a flowchart showing a method of inspecting the laser-irradiated nickel film 12 according to a first embodiment.

(First Embodiment) The inspection method of the laser-irradiated nickel film 12 according to the first embodiment will be described with reference to FIGS. 3 to 9. Here, FIGS. 6 and 8 have average values plotted therein, which were obtained by repeating color measurement of the nickel film 12 for 30 times. As shown in FIG. 9, the inspection method includes a reducing step S12. In the reducing step S12, a surface 12a of the nickel film 12 is reduced under a reducing gas atmosphere. By doing so, oxides on the nickel film 12 that were generated in the previously-executed laser irradiation step are removed. Specific aspects of the reducing step S12 are not particularly limited. As shown in FIG. 3, in this embodiment, the conductor member 10 provided with the nickel film 12 is disposed in a chamber 16, and reducing gas is introduced into the chamber 16. For example, hydrogen ($H_2$) may be employed as the reducing gas. However, the reducing gas is not limited to hydrogen, and carbon monoxide (CO), hydrogen sulfide ($H_2S$), sulfur dioxide ($SO_2$), nitrogen dioxide ($NO_2$) and the like may be employed. Although this is merely an example, the nickel film 12 may be heated in the reducing step S12, as needed.

Figure 5A:
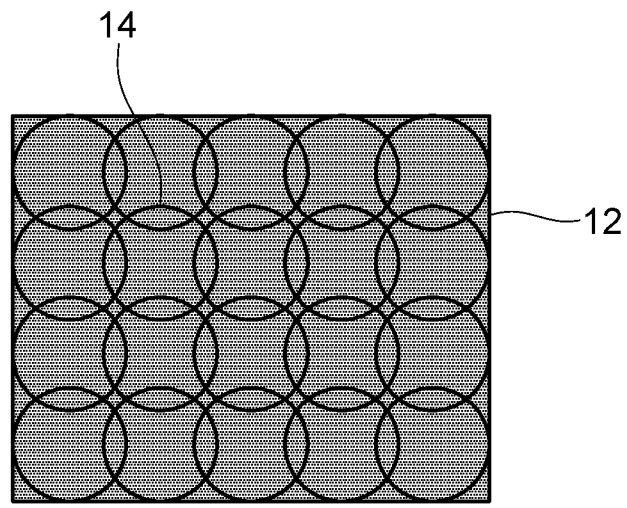
FIG. 5A shows a top view of the nickel film 12 after the heating step S14, and shows a condition thereof in which a color of the surface 12a of the nickel film 12 has changed due to nickel nitride having been generated.
Figure 5B:
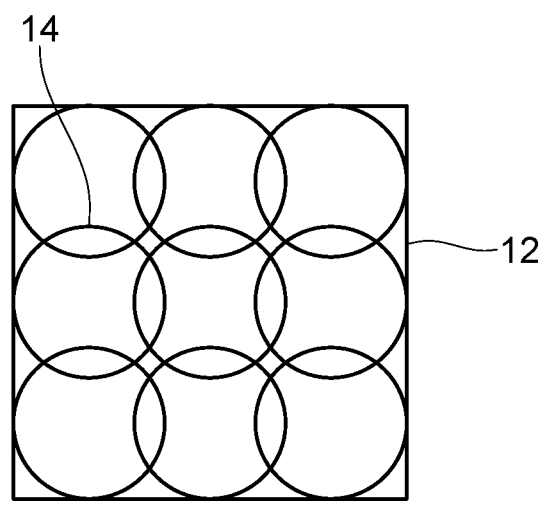
FIG. 5B shows a top view of the nickel film 12 after the heating step S14, and shows a condition thereof in which the color of the surface 12a of the nickel film 12 does not change due to nitriding reaction having not progressed sufficiently.

As shown in FIG. 9, the inspection method further includes a heating step S14. The heating step S14 is executed after the reducing step S12. In the heating step S14, the surface 12a of the nickel film 12 is heated under a nitrogen atmosphere. In doing so, if the fine concave-convex patterns are formed on the surface 12a of the nickel film 12, nitriding reaction occurs on the surface 12a of the nickel film 12 and nickel nitride is thereby formed on the nickel film 12. When the nickel nitride is formed on the nickel film 12, the color of the surface 12a of the nickel film 12 is thereby changed as shown in FIG. 5A. Contrary to this, if the fine concave-convex patterns are not formed on the surface 12a of the nickel film 12, the nitriding reaction does not progress sufficiently and the color of the nickel film 12 is less likely to be changed as shown in FIG. 5B. That is, if the processing parameters in the laser irradiation step are not suitable, the color of the nickel film 12 does not change or changes only subtly in the heating step S14.

Figure 4:
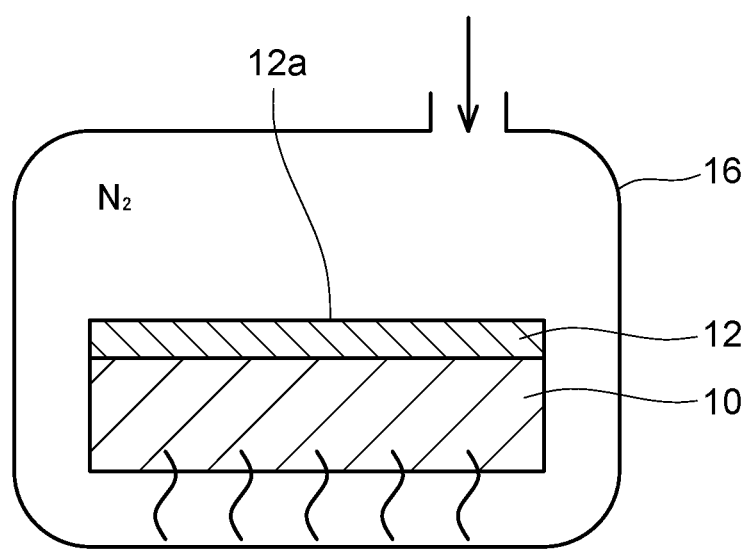
FIG. 4 is a schematic diagram showing a step of heating the surface 12a of the nickel film 12 under a nitrogen atmosphere (heating step S14).

Specific aspects of the heating step S14 are not particularly limited. In the present embodiment, as shown in FIG. 4, nitrogen is introduced to the chamber 16 in which the conductor member 10 is disposed to replace the atmosphere in the chamber 16 with the nitrogen. After the atmosphere in the chamber 16 has been sufficiently replaced with the nitrogen, the nickel film 12 of the conductor member 10 is heated to a predetermined heating temperature. In the heating step S14, the same chamber 16 as that used in the reducing step S12 can be used, by which the reducing step S12 and the heating step S14 can be executed in sequence. However, a chamber that is different from the chamber 16 used in the reducing step S12 may be used in the heating step S14. The heating temperature for the nickel film 12 in the heating step S14 may be 250° C. or higher. Preferably, the heating temperature for the nickel film 12 may be 285° C. or higher. More preferably, the heating temperature for the nickel film 12 may be 300° C. or higher. In the present embodiment, the heating temperature for the nickel film 12 is set to 300° C., and the heating is executed for several minutes at this temperature.

Figure 6:
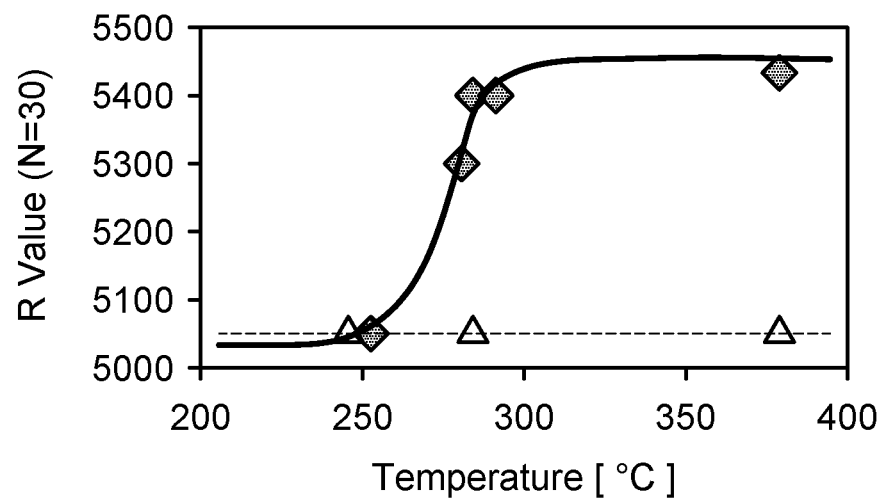
FIG. 6 is a graph showing an R value of the surface 12a of the nickel film 12 that changes according to a heating temperature in the heating step S14.

Here, a relationship between the heating temperature for the nickel film 12 in the heating step S14 and the color change that occurs in the nickel film 12 will be described with reference to FIG. 6. A horizontal axis of FIG. 6 shows the heating temperature in the heating step S14, and a vertical axis shows an R value of the nickel film 12 after the heating step S14. The R value is an index indicating a luminance of a red component in an RGB color measurement system. As shown by a solid line in FIG. 6, no significant change is observed in the R value of the nickel film 12 in a range where the heating temperature is less than 250° C. On the other hand, the R value of the nickel film 12 increases as the heating temperature rises in a range where the heating temperature is 250° C. or higher. Especially in a range where the heating temperature is from 250° C. to 285° C., a proportion of increase in the R value relative to increase in the heating temperature is large. In a range where the heating temperature is higher than 285° C., the proportion of increase in the R value is moderate. Then, the increase in the R value is extremely small in a range where the heating temperature is higher than 300° C.

As aforementioned, if the fine concave-convex patterns are present on the surface 12a of the nickel film 12, the nickel nitride is generated on the surface 12a of the nickel film 12 in the heating step S14 and the color of the surface 12a of the nickel film 12 is thereby changed. In regard to this point, according to the graph shown in FIG. 6, the nickel nitride is generated on the surface 12a of the nickel film 12 when the heating temperature is 250° C. or higher, which is exhibited in the color change of the surface 12a of the nickel film 12. As such, the heating temperature in the heating step S14 may be 250° C. or higher. Especially when the heating temperature is set to 285° C. or higher, or 300° C. or higher, the color of the surface 12a of the nickel film 12 changes significantly in the heating step S14. Due to this, as aforementioned, the heating temperature in the heating step S14 may be 285° C. or higher, or 300° C. or higher. A broken line and triangles plotted thereon in FIG. 6 show a result of a case where the reducing step S12 is omitted. In the case where the reducing step S12 is omitted, the nickel nitride is not generated even when the heating temperature in the heating step S14 is set to 300° C. or higher, thus the color of the surface 12a of the nickel film 12 does not change substantially.

As shown in FIG. 9, the inspection method further includes a color measuring step S16. The color measuring step S16 is executed after the heating step S14. In the color measuring step S16, the color of the surface 12a of the nickel film 12 is measured. Although this is merely an example, in this color measuring step S16, the surface 12a of the nickel film 12 is image-captured, and the color of the surface 12a of the nickel film 12 is quantified based on the captured image. That is, indexes indicating the color of the surface 12a of the nickel film 12 are acquired. In this embodiment, as the indexes indicating the color, the R value, a G value, and a B value defined by an RGB color specification system are acquired. The R value is the index indicating the luminance of the red component, the G value is an index indicating a luminance of a green component, and the B value is an index indicating a luminance of a blue component. However, the indexes acquired in the color measuring step S16 are not limited to indexes in the RGB color specification system, and may be indexes defined by other standards such as a L*a*b* color specification system and an XYZ color specification system. In this case, the color measurement may be executed by using color measuring devices corresponding to those color specification systems. In the color measuring step S16, at least the R value (or another index indicating the red component) simply needs to be acquired.

As shown in FIG. 9, the inspection method further includes a first assessing step S18. In the first assessing step S18, a condition of the surface 12a of the nickel film 12, especially, a processed condition of the nickel film 12 created by the laser irradiation, is assessed based on the R value (the index indicating the red component) from the color measuring step S16. As shown in FIG. 7, the measured R value is relatively large if the processed condition is good. On the other hand, the R value is relatively small in a case where laser power was low or extremely high. This means that the color change (that is, the generation of the nickel nitride) did not take place in the heating step S14 due to the fine surface patterns being not formed on the surface 12a of the nickel film 12. As such, by setting a predetermined reference value S(R), it can be assessed that the processed condition of the nickel film 12 created by the laser irradiation is good (that is, the fine concave-convex patterns are formed) in a case where the R value is greater than the reference value S(R). On the other hand, it can be assessed that the processed condition of the nickel film 12 created by the laser irradiation is defective (that is, the fine concave-convex patterns are not formed) in a case where the R value is less than the reference value S(R). As above, the condition of the surface 12a of the nickel film 12 is assessed based on the R value (the index indicating the red component), by which the laser-irradiated nickel film 12 can be evaluated objectively.

In addition, as shown in FIG. 9, the inspection method according to the present embodiment further includes a second assessing step S20. The second assessing step S20 may be executed after the color measuring step S16, and its execution order with regard to the first assessing step S18 may be arbitrary. In the second assessing step S20, the condition of the surface 12a of the nickel film 12, such as cleanliness of the nickel film 12, is assessed based on the B value (the index indicating the blue component) from the color measuring step S16. Specifically, in the second assessing step S20, whether organic compounds adhere to the nickel film 12 or not is assessed based on the B value. The organic compounds herein refer to sebum, release agent components of vinyl material, adhesive components of tape material, and the like. As shown in FIG. 8, when contamination of such organic compounds adheres to the nickel film 12, the B value is relatively large. This is because when the contamination of the organic compounds adheres to the nickel film 12, the color of the nickel film 12 changes to blue by chemical reaction of the adhered organic compounds and the nitride. Thus, by setting a reference value S(B), it is assessed that the organic compounds adhere to the nickel film 12 when the B value is greater than the reference value S(B). Due to this, the cleanliness of the nickel film 12 can be assessed based on the B value (the index indicating the blue component). However, the second assessing step S20 is not necessarily required. In case of the present embodiment, the R value and the B value can be color-measured simultaneously, and thus the cleanliness of the nickel film 12 can additionally be inspected.

In the inspection method according to the first embodiment, the result of the color measurement in the color measuring step S16 includes at least the index indicating the red component. However, not limited to the index indicating the red component, the technology disclosed herein may simply quantify the color of the nickel film 12 that is resulted from the nitriding reaction in the heating step S14. By quantifying the color of the nickel film 12, the condition of the surface 12a of the laser-irradiated nickel film 12 can be assessed. Due to this, the nickel film 12 can be inspected without dimension measurement of the laser marks 14 and water wettability test. The indexes to be color-measured may be changed to various indexes indicating other color components, which will be described below in another embodiment.

(Second Embodiment) An inspection method of the laser-irradiated nickel film 12 according to a second embodiment will be described. The inspection method according to the second embodiment differs from that of the first embodiment regarding the following points. Firstly, in the color measuring step S16, the color of the surface 12a of the nickel film 12 is measured such that the result includes at least the index indicating the blue component. Further, in the first assessing step S18, the condition of the surface 12a of the nickel film 12, such as the processed condition of the nickel film 12 created by the laser irradiation, is assessed based on the index indicating the blue component. Since other steps are similar to those of the first embodiment, descriptions thereof will be omitted.

In the color measuring step S16 according to the present embodiment, the color of the surface 12a of the nickel film 12 is measured after the heating step S14. Although it has been described above, in the color measuring step S16, the color of the surface 12a of the nickel film 12 is measured such that the result includes at least the index indicating the blue component. Although this is merely an example, in this color measuring step S16, the surface 12a of the nickel film 12 is image-captured and the color of the surface 12a of the nickel film 12 is quantified based on the captured image. That is, indexes indicating the color of the surface 12a of the nickel film 12 are acquired. In this embodiment, as the indexes indicating the color, the R value, the G value, and the B value defined by the RGB color specification system are acquired. The R value is the index indicating the luminance of the red component, the G value is the index indicating the luminance of the green component, and the B value is the index indicating the luminance of the blue component. However, the indexes acquired in the color measuring step S16 of the present embodiment are not limited to the indexes in the RGB color specification system, and may be indexes defined by other standards such as the L*a*b* color specification system and the XYZ color specification system. In this case, the color measurement may be executed by using the color measuring devices corresponding to those color specification systems. In the color measuring step S16, at least the B value (or another index indicating the blue component) simply may be acquired.

In the first assessing step S18 according to the present embodiment, the condition of the surface 12a of the nickel film 12, especially, the processed condition of the nickel film 12 created by the laser irradiation, is assessed based on the B value (the index indicating the blue component) from the color measuring step S16. As shown in FIG. 8, the measured B value is relatively small if the processed condition is good. On the other hand, the B value is relatively large in the case where the laser power was low or extremely high. This means that the color change (that is, the generation of the nickel nitride) did not take place in the heating step S14 due to the fine concave-convex patterns being not formed on the surface 12a of the nickel film 12. As such, by setting the predetermined reference value S(B), it can be assessed that the processed condition of the nickel film 12 created by the laser irradiation is good (that is, the fine concave-convex patterns are formed) when the B value is less than the reference value S(B). On the other hand, it can be assessed that the processed condition of the nickel film 12 created by the laser irradiation is defective (that is, the fine concave-convex patterns are not formed) when the B value is greater than the reference value S(B). As above, the condition of the surface 12a of the nickel film 12 is assessed based on the B value (the index indicating the blue component), by which the laser-irradiated nickel film 12 can be evaluated objectively.

What is claimed is:

1. A method of inspection of a laser-irradiated nickel film, the method comprising:
   reducing a surface of the laser-irradiated nickel film under a reducing gas atmosphere;
   heating the surface of the nickel film at 250 degrees Celsius or higher under a nitrogen atmosphere after the reducing;
   measuring a color of the surface of the nickel film after the heating; and assessing a condition of the surface of the nickel film based on a result of the color measuring.

2. The method according to claim 1, wherein
the result of the color measuring comprises at least an index indicating a blue component, and
the assessing of the condition comprises assessing the condition of the surface of the nickel film based on the index indicating the blue component.

3. The method according to claim 2, wherein
the assessing of the condition comprises assessing cleanliness of the nickel film based on the index indicating the blue component.

4. The method according to claim 3, wherein
the assessing of the condition comprises assessing whether an organic compound adheres to the nickel film or not based on the index indicating the blue component.

5. The method according to claim 4, wherein
the assessing of the condition comprises assessing that the organic compound adheres to the nickel film when the index indicating the blue component is greater than a predetermined reference value.

6. The method according to claim 2, wherein
the assessing of the condition comprises assessing a processed condition of the nickel film created by the laser irradiation based on the index indicating the blue component.

7. The method according to claim 6, wherein
the assessing of the condition comprises assessing that the processed condition of the nickel film created by the laser irradiation is defective when the index indicating the blue component is greater than a predetermined reference value.

8. The method according to claim 1, wherein
the result of the color measuring comprises at least an index indicating a red component, and
the assessing of the condition comprises assessing the condition of the surface of the nickel film based on the index indicating the red component.

9. The method according to claim 8, wherein
the assessing of the condition comprises assessing a processed condition of the nickel film created by the laser irradiation based on the index indicating the red component.

10. The method according to claim 9, wherein
the assessing of the condition comprises assessing that the processed condition of the nickel film created by the laser irradiation is defective when the index indicating the red component is less than a predetermined reference value.

* * * * *